United States Patent [19]

Scherer et al.

[11] Patent Number: 4,931,169
[45] Date of Patent: Jun. 5, 1990

[54] APPARATUS FOR COATING A SUBSTRATE WITH DIELECTRICS

[75] Inventors: Michael Scherer, Rodenbach; Rudolf Latz, Frankfurt; Ulrich Patz, Linsengericht, all of Fed. Rep. of Germany

[73] Assignee: Leybold Aktiengesellschaft, Fed. Rep. of Germany

[21] Appl. No.: 250,381

[22] Filed: Sep. 28, 1988

[30] Foreign Application Priority Data

Jun. 22, 1988 [DE] Fed. Rep. of Germany ..... 38212072

[51] Int. Cl.$^5$ .............................................. C23C 14/34
[52] U.S. Cl. ........................... 204/298.11; 204/192.12; 204/298.18
[58] Field of Search .................. 204/298 PS, 298 GF, 204/298 MS, 298 ME, 298 FP, 298 PM, 192.12

[56] References Cited

U.S. PATENT DOCUMENTS

| | | | |
|---|---|---|---|
| 3,461,054 | 8/1969 | Vratny | 204/298 PS |
| 3,617,459 | 11/1971 | Logan | 204/298 PS |
| 3,679,571 | 7/1972 | Ensslin | 204/298 PS |
| 3,767,551 | 10/1973 | Lang, Jr. et al. | 204/298 PS |
| 4,572,842 | 2/1986 | Dietrich et al. | 204/298 GF |

Primary Examiner—Nam X. Nguyen
Attorney, Agent, or Firm—Limbach, Limbach & Sutton

[57] ABSTRACT

The invention relates to an apparatus for coating a substrate (1) with dielectrics which has a dc current source (10) connected to an electrode (5) which is connected to a target (3) which is being sputtered. The sputtered particles of the target (3) form a compound with an introduced substance which is deposited on the substrate (1). Permeating the target (3) are toroidal magnetic fields whose field lines emerge in the region of magnetic poles from the surface of the target (3). Under the invention an ac voltage source (30) is provided whose output voltage is superimposed on the dc voltage of the dc current source (10). Here, the electrical output of the ac current source (30) which is supplied to the electrode (5) corresponds to 5% to 25% of the output supplied by the dc current source (10) to the electrode (5).

17 Claims, 4 Drawing Sheets

APPARATUS FOR COATING A SUBSTRATE WITH DIELECTRICS

FIELD OF THE INVENTION

The invention relates to an apparatus for coating a substrate with dielectrics having a dc current source which is connected to an electrode electrically connected to a target which is sputtered and whose pulverized particles form a compound which is deposited on the substrate, with toroidal magnetic fields permeating the target whose field lines emerge from the surface of the target in the region of the magnetic poles.

BACKGROUND OF THE INVENTION

Coating substrates with metals using the sputtering or disintegration process is relatively simple since metals are good electrical conductors. It is significantly more difficult to coat substrates with oxide layers which have no or only very low electrical conductivity. In order to be able to deposit also oxides and other dielectrics on a substrate despite this difficulty, metal particles are generated through means of dc current sputtering which subsequently are converted in a reactive atmosphere to oxides and deposited on the substrate.

Converting the metal particles into oxides in this process takes place in the immediate vicinity of the substrate and at a distance from the sputtering cathode in order to also avoid the deposition of oxides on this cathode with a concomitant decrease of the sputtering rate. Nevertheless, in practice it is not possible to keep the cathode entirely free of oxides so that the sputtering rate gradually decreases significantly.

If sputtering is carried out with magnetron cathodes, the problem arises that there where the magnetic field lines have their maxima of curvature, sputtering is most intense so that a sputter groove originates. The intense sputtering at these sites prevents the deposition of oxides. On those regions of the target which are not sputtered off at all or only very slowly, however, nonconducting dielectric films form under the influence of reactive gases. These growing regions are charged electrostatically, are starting points of spontaneous flashovers on the target surface and, as a consequence, of flashovers between target and plasma or target and the substance surrounding the target. During these flashovers the cathode current must briefly be reduced so that the discharge arc can be quenched which, however, entrains further instabilities until the discharge finally ceases.

In dc current magnetron sputtering, in contrast to pure diode sputtering, partial covering of the target with reaction products cannot be prevented, at best it can only be kept low by optimizing the magnetic field.

A starting point for the solution of the problem is obtained, if, instead of a dc voltage a high frequency (HF) ac voltage between target electrode and substrate is applied. In this HF magnetron sputtering in a reactive atmosphere no flashovers occur on the target surface and no electrostatic charging takes place. However, in pure HF sputtering the sputtering rate is relatively low.

It is, however, also known to deposit tantalum and tantalum oxide on a substrate using a dc current sputtering process in which an HF voltage is superimposed on the dc voltage (F. Vratny: Deposition of tantalum and tantalum oxide by superimposed RF and DC sputtering; Conference Paper on Thin Film Dielectrics, Oct. 7 to 11, 1968, Reprint from J. Electrochem. Soc., 114-5, 505, 1967). The combined dc current/ac current field increases the plasma density and prevents the formation of a dielectric film on the cathode during the reactive sputtering. Thereby it becomes possible to achieve at sputtering pressures of 0.5 to 2 millitorr a tantalum deposition rate of approximately 80 Å/min and a twofold increase of tantalum deposition rate at pressures in the range of 10 to 20 millitorr. A deposition rate of 50 to 100 Å/min obtains for coatings of $Ta_2O_5$ and $MnO_x$ during reactive sputtering in pure oxygen.

The increase of the deposition rate can be explained by the fact that in an applied HF field the charged particles perform an oscillating motion. The electrons which migrate under the influence of the superimposed field cover a greater distance than the electrons which are only exposed to a dc field. The greater distance increases the probability of electron gas/atom collisions which leads to an increase of the current density of the positive ions at the cathode at a given pressure. This, in turn, effects an increase of the sputtering rate and layer deposition. How the electrons react in the gas depends on the gas pressure or the free path length of the electron, the frequency of the HF field and the apparatus of the electrodes. At low pressures if the mean free path length is greater than the distance between the electrodes, the electrons are excited and traverse the space between the electrodes nearly entirely without collisions with the gas. For example, the electrons in argon with an energy of 0.4 eV at a pressure of 10 millitorr have a mean free path length of 10 cm which corresponds approximately to the distance of conventional electrodes. At pressures at which the mean free path length of an electron is less than the distance of the electrodes and the frequency of the field is less than the collision frequency of the gas, the electrons collide several times with each oscillation and have a tendency to move with the phase of the field. Examples for this are the low-frequency ac current sputtering as well as the low-frequency dc current/ac current sputtering in which the electrons bombard the cathode and the substrate in succession. At high frequencies the electrons are able to carry out numerous oscillations of small amplitude between the gas collisions. In this case the electron cloud appears stationary, which results in an intense plasma which can be drawn off with a superimposed dc field. At still higher frequencies, for example in the microwave range, the electrons are under the influence of a standing wave with electric and magnetic components. Due to this influence the electrons are distributed in space in accordance with the spatial conditions, i.e. as a function of the electrode dimensions and the frequency which generates the standing wave.

The presence of the HF field functions, in addition, to prevent a deposition of a dielectric coating on the cathode during reactive sputtering with an electro-negative gas. Since the ion density can be maintained through the HF field, the bombardment at the cathode decreases the probability of the formation of a significant insulator coating. If an insulator coating should be produced, the HF-induced charge at the surface would maintain the sputtering process and, in addition, decrease the process of insulation formation. Due to the greater ionization probability and the decrease of the breakdown strength of the gas, the HF field permits operation at lower sputtering pressures than normally occur during diode sputtering.

The above described known apparatus refers to diode sputtering or diode disintegration. Diode sputtering, however, has the disadvantage that for numerous applications it has too low a deposition rate, and specifically even if ac current superposition is made use of. The above mentioned sputtering with a magnetron cathode yields substantially higher sputtering rates.

It is also known to combine magnetron sputtering with microwave radiation (U.S. Pat. No. 4 610 770=EP 0 148 504). The microwave radiation in this case is intended to prevent the target being sputtered off only where the toroidal field lines of the magnetron electrode are located. The sputtering area, thus, is increased considerably in order to increase the sputtering rate and to keep the target from being eroded not only in a narrowly limited region. In order to achieve this goal a mirror magnetic field is generated with only two permanent magnets which are arranged on a common axis and coaxially to each other. In this manner a magnetic flux distribution is obtained in which the lines of the magnetic flux expand in the intermediate region between the magnets and contract again in the vicinity of the magnets. Of disadvantage here is the costly microwave irradiation with hollow waveguides or similar means as well as the complicated structuring of the permanent magnets.

SUMMARY OF THE INVENTION

The present invention is based on the task of avoiding, in a conventional magnetic sputtering installation in which the field lines of the permanent magnets form toroids which permeate the material to be sputtered, the disturbing charging effects on the target.

This task is solved in that an ac current source is provided whose output voltage is superimposed on the dc voltage of the dc current source, and that the voltage of the ac current source, which is supplied to the electrode corresponds to 5% to 25% of the output supplied by the dc current source to the electrode.

The advantage achieved with this invention consists in particular in that a largely disturbance-free deposition of dielectrics, for example $SiO_2$, $Al_2O_3$, $Si_3N_4$ or AlN, at high rates becomes possible by means of reactive sputtering with conventional magnetron cathodes.

All of the advantages of reactive dc current sputtering are retained because the superimposed HF component reduces the potential difference on the target whereby the disturbing charging effects on the target are avoided which, in turn, are responsible for the fact that the discharge ceases due to permanent arcing. The HF component, hence, is not intended to serve the purpose (as is the case in prior art), of, first, increasing the sputtering rate by increasing the plasma density and, second, of sputtering away the nonconducting areas on the target but rather that on the nonconducting target areas which unavoidably form during reactive magnetron sputtering no disturbing charging effects occur. To this end, the dc voltage is modulated with an HF voltage in such a way that precisely the disturbing charging effects on the target are avoided.

An embodiment of the invention is shown in the drawing and explained below in greater detail.

DETAILED DESCRIPTION OF THE DRAWINGS

Figure 1:
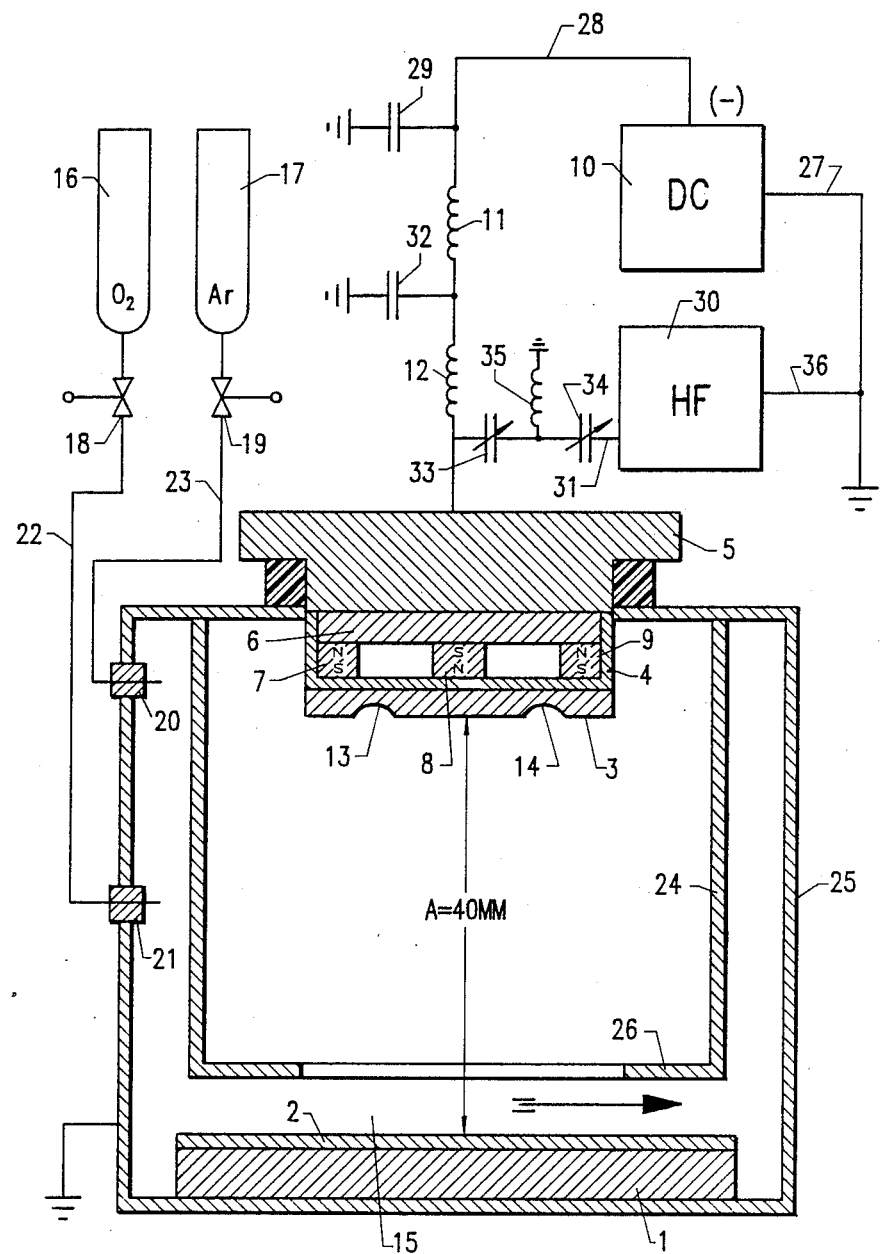
FIG. 1 shows a basic representation of the apparatus according to the invention.

In FIG. 1 a substrate 1 is shown which is to be provided with a thin layer 2 of a dielectric. Opposing this substrate 1 is a target 3 which is to be sputtered. Target 3 is connected via an element 4 which is U-shaped in section to an electrode 5 which rests on a yoke 6 which encloses between itself and element 4 three permanent magnets 7, 8, and 9.

The polarities of the poles of the three permanent magnets 7, 8, and 9 directed toward target 3 alternate so that in each instance the south poles of the two outer permanent magnets 7 and 9 together with the north pole of the center permanent magnet 8 effect an approximately circular arc-shaped magnetic field through target 3. This magnetic field compresses the plasma in front of target 3 so that there where the magnetic fields have the maximum of their circular arcs it has its greatest density. The ions in the plasma are accelerated by an electric field which builds up due to a dc voltage which is supplied by a dc current source 10. The negative pole of this dc current source 10 is connected via two inductors 11 and 12 to electrode 5. The electric field is oriented perpendicularly to the surface of target 3 and accelerates the positive ions of the plasma in the direction of this target. Hereby a multiplicity of atoms or particles are ejected from target 3 and, specifically, from regions 13 and 14, where the magnetic fields have their maxima. The sputtered atoms or particles migrate in the direction of substrate 1 where they are deposited as thin layer 2.

If the target 3 material is a metal and if on the substrate 1 an oxide layer is to be deposited then the particles ejected from target 3 react in a space 15 with particular gases which are introduced from gas tanks 16 and 17 through valves 18 and 19 and inlet feedthroughs 20 and 21, via gas feed pipes 22 and 23 into this space 15. This space 15 is formed by two containers 24 and 25 of which the one container 25 also contains substrate 1 while the other container 24 ends in front of substrate 1 and forms a diaphragm 26. Both containers 24 and 25 and, consequently, also substrate 1 which rests on the bottom of container 25 are at ground potential. Connected to ground is also the second pole 27 of the dc current source 10 whose first pole 28, apart from inductors 11 and 12, is also connected to a capacitor 29 which, in turn, is connected to ground.

According to the invention, aside from the dc current source 10, also an HF source 30 with terminal 31 is connected to electrode 5, and specifically via two variable capacitors 33 and 34 between which another inductor 35 is interconnected which is grounded. The connecting point of the two other inductors 11 and 12 is connected to a capacitor 32 which (as will as also the second terminal 36 of the HF source 30) is also grounded.

The capacitors 29 and 32 as well as the enclosed inductor 11 form a lowpass filter which prevents high frequencies from passing through. Inductor 12 reinforces this effect further. Capacitors 33 and 34 as well as inductor 35 form an adaption network for the HF feed to cathode 5. They simultaneously function as highpass filter, i.e. the dc voltage cannot reach ac current source 30.

The gas in the apparatus according to FIG. 1 does, in fact, reach the interspace between the first and the second container 25 and 24 but it could also be introduced through a gas distribution system surrounding cathode 5 to the second container 24.

For controlling the apparatus represented in FIG. 1 a process control computer can be provided which processes measurement data and outputs control commands. To this process control computer, for example, the values of the measured partial pressure in the processing chamber 25 can be supplied. On the basis of these and other data it can, for example, regulate the gas flow via valves 18 and 19 and set the combination of dc and ac voltage at the cathode. The process control computer is also in the position of being able to regulate all other variables, for example cathode current, HF output, and magnetic field strength. Since such process control computers are known, a description of their configuration will be omitted.

FIG. 1 does not show specifically how the HF supply is regulated internally. It is, however, known to design a regulator circuit in such a way that upon presetting a particular nominal value the supplied output is constantly regulated at this preset value.

Figure 2:
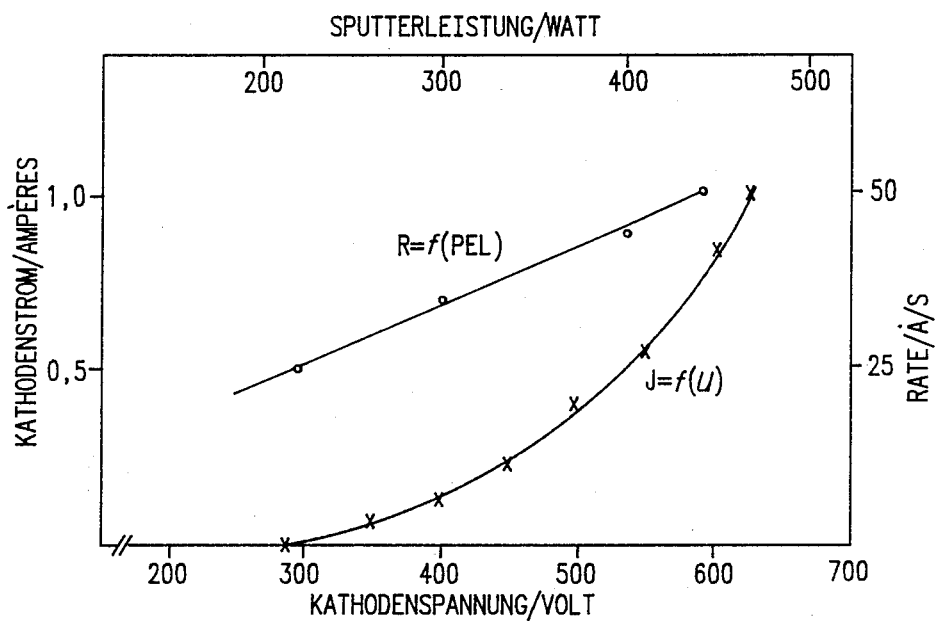
FIG. 2 a graphic representation of the cathode current as a function of the cathode voltage as well as the sputtering rate over the sputtering output at a pressure of $7\times 10^{-3}$ mbar in a known dc current magnetron sputtering apparatus.

The processes taking place during pure dc current magnetron sputtering are shown graphically in FIG. 2. These processes are important to a comprehension of the working embodiment of the apparatus according to the invention described further on. It can be seen in FIG. 2, which refers to a pure inert gas atmosphere of argon and a gas pressure of $7 \times 10^{-3}$ mbar, that the cathode dc current is clearly a function of the dc cathode voltage and conversely. Since the resistance decreases with increasing voltage, which can be traced back to the formation of a conductive plasma, current $J = f(U)$ increases approximately parabolically. Sputtering rate R expressed in Å/s increases linearly with increasing sputtering output which is illustrated by the straight line $R = f(Pel)$. At 440 W. which corresponds to a power density of 10 W/cm$^2$ the rate is 50 Å/s.

Figure 3:
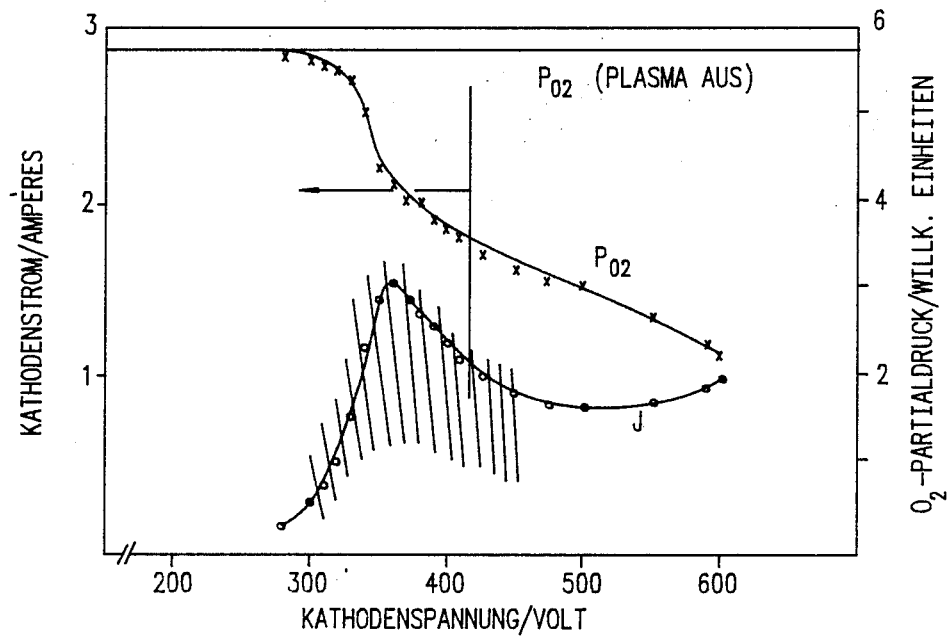
FIG. 3 a graphic representation of the cathode current as well as the $O_2$ partial pressure as a function of dc current cathode voltage at an argon pressure of $7\times 10^{-3}$ mbar, a constant $O_2$ flow of 6.7 SCCM/min and an Al target.

In FIG. 3 the cathode current as a function of the cathode voltage as well as the dependence between $O_2$ partial pressure and cathode voltage in the pure dc current case and with preset argon and oxygen flows are illustrated. The measurement curves of FIG. 2 were recorded at a mass flow $f_{O2}$ of oxygen of 6.7 SCCM/min=const, where SCCM/min corresponds to standard cm$^3$/min.

In contrast to the representation in FIG. 2, FIG. 3 represents the conditions during reactive dc current sputtering. From the current-voltage characteristic it is apparent that the current J with increasing voltage is still clearly a function of this voltage. With increasing voltage the current increases initially very steeply but then reaches a maximum and decreases from there in order to subsequently again increase somewhat. If, however, the voltage is reduced from high voltages by approximately 600 V, the current does, indeed, initially decrease with decreasing voltage, if a primarily metallic target state is assumed, however, with further voltage reduction the current increases strongly which can be traced back to the increased oxide formation on the target surface. Below 350 V the current decreases rapidly again connected to a strong increase of the $O_2$ partial pressure. In the range of approximately 450 V and 350 V the secondary electron yield of $Al_2O_3$ which is deposited on the target increases under argon ion bombardment. By contrast, in the range below 350 V the target is coated with $O_2$ molecules without $Al_2O_3$ forming on the target. This $O_2$ is sputtered by impinging argon ions so that the secondary electron effect is reduced. Of disadvantage in the reactive dc current operation is that precisely that cathode voltage range in which absorption-free layers form on the substrate (thus, in the range of approximately 300 V to 400 V) is an unstable range in which after a while arcing occurs or even plasma loss. The operating points must, therefore, be traversed rapidly so that the discharge does not cease.

As already mentioned, the cathode current J is clearly a function of the cathode voltage, that is for each voltage value there exists precisely one current value. The converse, however, is not true. If one exchanges the two axes of FIG. 3 and plots U on the vertical and J on the horizontal axis, the voltage curve describes an S which at one current value has two voltage values.

Figure 4:
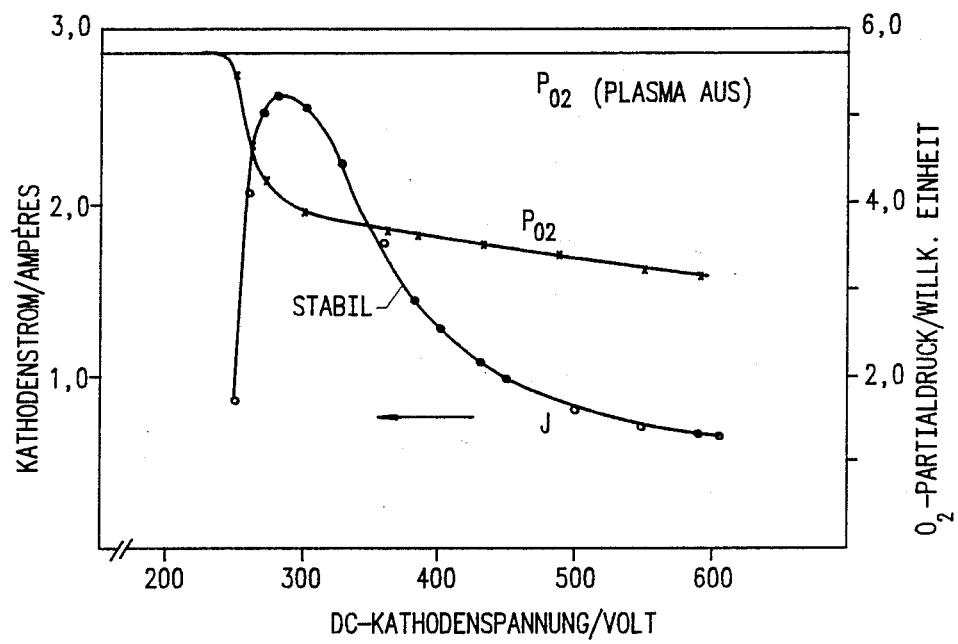
FIG. 4 a graphic representation of the cathode current and the $O_2$ partial pressure as a function of the dc current cathode voltage at an argon pressure of $7\times 10^{-3}$ mbar, a constant $O_2$ flow of 6.7 SCCM/min, a superimposed HF voltage with an amplitude of 140 V and an Al target.

In FIG. 4 the $O_2$ partial pressure and the discharge current are shown as functions of the dc current cathode voltage under the same conditions as in FIG. 3, now, however, for the case of HF-modulated cathode voltage. The modulation frequency here amounts to 13.56 MHz, the HF amplitude to 140 V, and the effective HF power at the cathode is constant at 20 W. Absorption-free $Al_2O_3$ layers are obtained below 425 V, thus similarly to the case of pure dc current of FIG. 3. Now, however, the discharge is completely stable and free of arcing. At the operating point at approximately 420 V in experiments the discharge was operated for several hours without flashovers occurring. Between 500 V and 360 V the voltage current characteristics of FIG. 3 and FIG. 4 agree within a few percent deviation, Compared to FIG. 3, the continued strong current increase which can be observed in FIG. 4 below 360 V can be explained in that the HF component is initially able to prevent the adsorption of $O_2$ molecules on the target surface whereby the increased secondary electron yield is not disturbed. More secondary electrons do, indeed, lead to an increase of the ion current through collision ionization but primarily to an apparent ion current increase by increasing the electron current away from the cathode. This effect broadens the operating range while the sputtering rate changes only little with decreasing voltage which is shown by the relatively slight increase of the $O_2$ partial pressure. At the operating point of 420 V the rate for $Al_2O_3$ is 25 Å/s at a power of approximately 470 W, i.e. the rate compared to pure metal rate has only sunk to half of the value. Below 280 V the current decreases strongly, which can be traced back to the O₂ coating of the target and the decrease of the sputter effect at low voltages. Above 500 V the current which flows at a voltage with HF component is less than in the case of pure dc current of FIG. 3. Clearly, the hf voltage has here an influence on the plasma.

Figure 5:
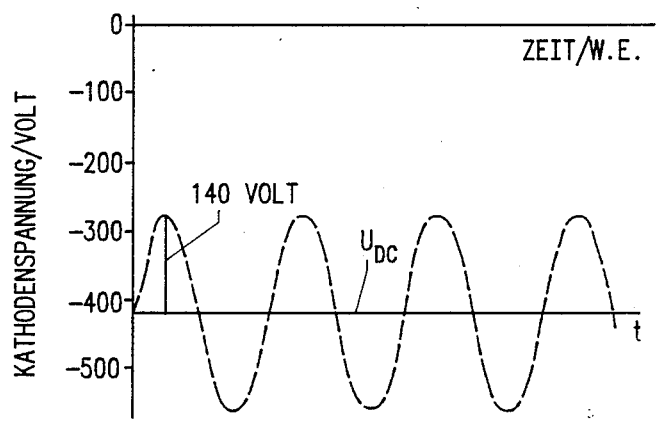
FIG. 5 a graphic representation of a dc current cathode voltage on which an ac voltage is superimposed.

In FIG. 5 the modulated voltage is shown which is applied to electrode 5. This is a dc voltage of −420 V on which an HF voltage with an amplitude of 140 V is superimposed. This voltage is preferentially applied when the argon pressure in the processing chamber is $7 \times 10^{-3}$ mbar and if aluminum is to be sputtered and oxidation with oxygen is to take place. The effective HF power is set to 20 W and the dc current which flows through electrode 5 is approximately 1.14 A.

Figure 6:
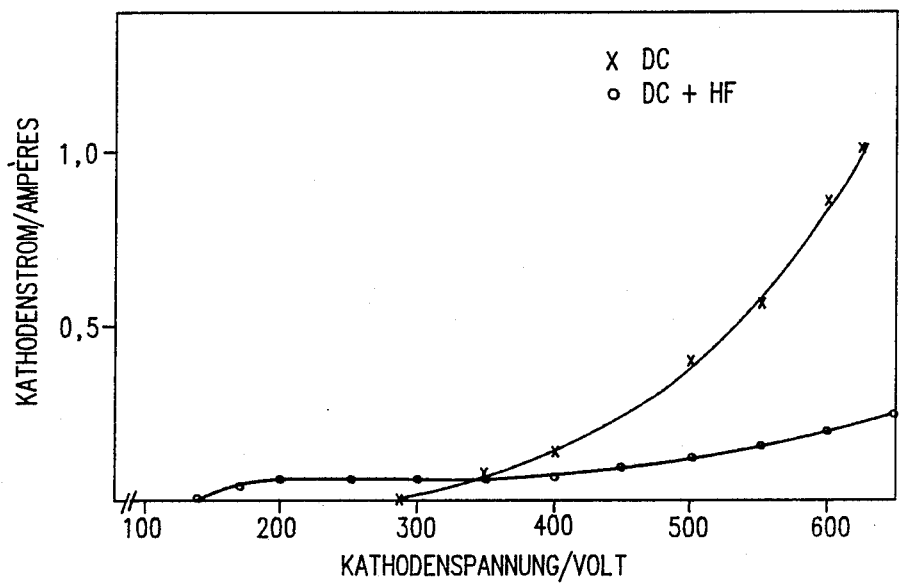
FIG. 6 a graphic representation of the cathode current as a function of the cathode dc voltage and the combination of dc voltage and superimposed ac voltage in a pure argon atmosphere.

The effect of the HF on plasma is clearly evident in FIG. 6 which shows current/voltage characteristics in a pure argon atmosphere. The characteristic whose measured points are marked by a cross represents the current/voltage characteristic during pure dc current operation, while the characteristic whose measured points are marked by a circle represents the current-/voltage characteristic at modulated voltage. The HF power at cathode 5 is here approximately 20 W. This effective powers was determined in a comparison of the sputtering rates in the case of pure dc current and in the HF case. In FIG. 6 two essential points can be recognized: Starting from typical power densities of 10 W/cm² for dc current magnetron discharges (approximately 600 V/0.8 A in FIG. 6) the dc current discharge current at identical dc voltage sinks already at 20 W superimposed HF power, i.e., at a modulation amplitude of approximately 140 V the current decreases to only 0.18 A.

For a magnetic field supported dc current magnetron discharge HF modulation of approximately 5% of the original dc current power has already drastic effects. The dc current output power is reduced to approximately 100 W=2.3 W/cm². Clearly the HF ac field disturbs the electron drift current circulating in front of cathode 5. The electrons which can follow the HF ac field are on the average further removed from cathode 5, which is equivalent to a decrease of their collision probability. Coupled to it are also increased electron drift losses.

This result contradicts Vratny's observations (loc. cit) during pure diode sputtering operations, according to which when a diode is supplied with an HF-modulated dc voltage a marked increase of the dc current discharge current takes place. The HF power of approximately 200 W indicated by Vratny is approximately 43% of the given dc current and HF power. Whether or not this is the HF power actually effective on the cathode, is not said.

With decreasing dc current cathode voltage the dc current discharge current in FIG. 6 continues to decrease slowly with HF modulation. Below 350 V the dc current is above the discharge current for pure dc current discharge. While the pure dc current discharge is quenched at 290 V, the dc current component of the HF-modulated discharge decreases back to zero only at 140 V, the natural dc current potential of the pure HF discharge.

In the case of the magnetron, thus, between the dc current potential of the pure HF discharge and the firing range of the pure dc current discharge, in the case of HF-modulated dc current an increase of the dc current component can be observed. In this range which is of secondary significance for the reactive process, the high ionization effect of HF discharges is determining.

The results and observations made by Vratny (loc. cit.) during pure diode sputtering are coupled in general to this effect which is of less importance for the present invention.

The hardly foreseeable and in reality unwelcome effect of decreasing dc current in wide ranges of the dc current magnetron discharge by HF modulation of low power is overcompensated during reactive operations by the partial target oxidation by increased secondary electron yield.

The height of this effect depends on the material and the gas used. For Al, Si, Sn in Ar/O₂ atmosphere as well as Al and Si in Ar/N₂ atmosphere this effect has already been found out during experiments.

What is claimed is:

1. An improved apparatus for coating a substrate with dielectrics, the apparatus having a dc voltage source which is connected to an electrode which in turn is connected to a target which is sputtered and whose sputtered particles form a compound with an introduced substance, the compound being deposited on the substrate, the apparatus further having toroidal magnetic fields permeating the target with field lines emerging in the region of the magnetic poles from the surface of the target, the improvement comprising:
    an ac voltage source whose output voltage is superimposed on the dc voltage of the dc voltage source; and
    the voltage output of the ac voltage source is coupled to the electrode and equals 5% to 25% of the voltage output supplied to the electrode by the dc voltage source.

2. Apparatus as recited in claim 1, wherein the ac voltage source is a high frequency voltage source.

3. Apparatus as recited in claim 2, wherein the dc voltage source is regulated with respect to current, voltage or output power.

4. Apparatus as recited in claim 1 or 2, wherein the ac voltage output is 10% of the dc voltage output.

5. Apparatus as recited in claim 1, wherein the dc voltage source is coupled to the electrode via first and second inductors.

6. Apparatus as recited in claim 5, wherein between the dc voltage source and the first inductor a capacitor couples the dc voltage source to ground potential.

7. Apparatus as recited in claim 5, wherein between the first inductor and the second inductor a capacitor couples the first inductor to ground potential.

8. Apparatus as recited in claim 1, wherein the ac voltage source is coupled to the electrode via first and second capacitors.

9. Apparatus as recited in claim 1, wherein a first container is provided in which is located a second container having an opening which defines a diaphragm, with the substrate to be coated facing the target through this opening of the second container, and further wherein one or more gases are introduced into the interspace between the first and the second containers.

10. Apparatus as recited in claim 1, wherein the ac voltage source supplies an ac voltage having a frequency of 13.56 MHz.

11. Apparatus as recited in claim 1, wherein the target consists of aluminum and the compound deposited on the substrate consists of Al₂O₃.

12. Apparatus as recited in claim 1, wherein the target consists of conductive silicon and the compound deposited on the substrate consists of $SiO_2$.

13. Apparatus as recited in claim 1, wherein the target consists of aluminum and the compound deposited on the substrate consists of AlN.

14. Apparatus as recited in claim 1, wherein the target consists of conductive silicon and the compound deposited on the substrate consists of $Si_3N_4$.

15. Apparatus as recited in claim 1, wherein the dc voltage source, when a target of Al, Si or Sn is used, is regulated with respect to voltage.

16. Apparatus as recited in claim 1, wherein the dc voltage source, when sputtering a target of Al, Si, Sn or In/Sn in an argon/oxygen atmosphere, is regulated with respect to voltage.

17. Apparatus as recited in claim 1, wherein the dc voltage source, when a target of Al or Si is sputtered in an argon/nitrogen atmosphere, is regulated with respect to voltage.

* * * * *